(12) United States Patent
Riva et al.

(10) Patent No.: US 6,301,157 B1
(45) Date of Patent: Oct. 9, 2001

(54) METHOD AND CIRCUIT FOR TESTING MEMORY CELLS IN A MULTILEVEL MEMORY DEVICE

(75) Inventors: Marco Riva, Lallio; Paolo Rolandi, Voghera; Massimo Montanaro, Pavia, all of (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 09/415,024

(22) Filed: Oct. 7, 1999

(30) Foreign Application Priority Data

Oct. 29, 1998 (EP) .................................................. 98830654

(51) Int. Cl.[7] .................................................. G11C 16/06
(52) U.S. Cl. .............................. 365/185.22; 365/185.09; 365/185.2; 365/185.03
(58) Field of Search ........................... 365/185.22, 185.2, 365/185.03, 185.09

(56) References Cited

U.S. PATENT DOCUMENTS

| | | | |
|---|---|---|---|
| 5,568,419 | * 10/1996 | Atsumi et al. | 365/185.3 |
| 5,602,789 | 2/1997 | Endoh et al. | 365/201 |
| 5,694,356 | 12/1997 | Wong et al. | 365/185.03 |
| 5,754,558 | * 5/1998 | Hayakawa et al. | 365/201 X |

FOREIGN PATENT DOCUMENTS

0856850A2  8/1998  (EP) .

* cited by examiner

Primary Examiner—Huan Hoang
(74) Attorney, Agent, or Firm—Theodore E. Galanthay; E. Russell Tarleton; Seed IP Law Group PLLC

(57) ABSTRACT

A method for testing memory cells, and in particular virgin memory cells, in a multilevel memory device having a plurality of memory cells. The method includes reading the individual memory cells that constitute a memory device and comparing each one of these memory cells with at least one reference memory cell at a time, so as to determine whether the threshold of the memory cells is lower than the threshold of the at least one reference memory cell or not; determining the number of the memory cells whose threshold is higher than the threshold of the at least one reference cell; the at least one reference memory cell being chosen with a gradually higher threshold; when the number of memory cells whose threshold is higher than a given reference threshold is found to be sufficiently lower than the number of redundancy memory cells provided in the memory device, assuming the given reference threshold as lower reference threshold for the memory device, determining a statistical distribution of the thresholds of the memory cells.

22 Claims, 1 Drawing Sheet

METHOD AND CIRCUIT FOR TESTING MEMORY CELLS IN A MULTILEVEL MEMORY DEVICE

TECHNICAL FIELD

The present invention relates to a method and a circuit for testing memory cells in a multilevel memory device.

BACKGROUND OF THE INVENTION

It is known that one of the tests performed in the preliminary steps for checking a permanent memory device is a test which allows to identify the cells of memory devices that are not erased sufficiently by an exposure to ultraviolet rays or that lose their erased state for various reasons.

This test consists in comparing the threshold in all the cells of the memory matrix with the threshold of an appropriate reference cell by means of a normal read operation performed with a sense circuit constituted by a sense amplifier which receives in input a signal from a cell being tested and a signal from the reference cell.

In this case, the reference cell has a threshold which identifies it as neither programmed nor virgin.

The cells compared with the reference cell must therefore have a lower threshold in order to assuredly be virgin cells.

The memory cells rejected as a consequence of this check are made redundant by means of the redundancy lines, which therefore allow to restore the "damaged" cells and therefore preserve the integrity of the memory device.

In two-level memories, since the distance, in terms of difference in output signal, between the threshold of a virgin cell and the threshold of a programmed cell is rather large, it is not necessary to have, as in the previous case, a reference cell with a threshold that lies between the threshold of a virgin cell and the threshold of a programmed cell; the same effect is achieved by using a virgin cell as reference and by unbalancing the two branches of the sense amplifier.

In a multilevel memory, each individual cell must instead contain a plurality of logic states: for example, in a four-level memory there are four logic states, "11", "10", "01" and "00", which are mutually separated by three reference levels (thresholds), designated respectively by Vr1, Vr2 and Vr3 in FIG. 1, which are used to discriminate the four logic states during reading.

FIG. 1 charts the threshold of a cell as a function of the number of cells.

The above-mentioned logic values that the cell can assume are mutually separated by the above-mentioned three references together with the supply voltage Vcc.

The condition in which the cell is erased in an optimum manner corresponds to the logic state "11", in which the threshold of the cell is below the threshold of the lowest reference Vr1.

The curve plotted in the chart of FIG. 1 shows the distribution of virgin cells.

For technological reasons, the choice of the references should not be made in advance, i.e., regardless of the device being considered, as instead occurs in a two-level memory.

Erasure of the matrix cells by means of ultraviolet rays in fact produces a statistical distribution of their thresholds (as shown in FIG. 1), and since the above-described testing method eliminates memory cells whose threshold is higher than the reference Vr1, an excessively low threshold Vr1 entails the risk of eliminating an excessive number of memory cells which are in the upper trailing part of the statistical distribution, so that the redundancy lines are not sufficient to replace all the eliminated memory cells.

Vice versa, an excessively high threshold Vr1 reduces the interval between said threshold and the supply voltage Vcc, in which the upper references of Vr2 and Vr3 must be defined.

Therefore, since not only the thresholds of virgin cells but also the thresholds of cells written with a given logic value have a certain statistical distribution with respect to their average value, a reduction of the intervals above the minimum threshold Vr1 that define the logic level entails an increase in the probability of an error when reading the cell.

The narrower the intervals between the logic write levels, the higher the likelihood that said logic levels will not be discriminated with sufficient precision.

SUMMARY OF THE INVENTION

The present invention provides a method and a circuit for testing memory cells, and, more particularly, for testing virgin memory cells in a multilevel memory that enables determination of an optimum lower reference threshold and replacement of any damaged cells with redundancy cells.

Within the scope of the present invention is a method for testing memory cells in a multilevel memory which provides for a measurement of the statistical distribution of the thresholds of the matrix cells from which the optimum lower threshold can be obtained.

The present invention also provides a method and a circuit for testing memory cells in a multilevel memory in which the intervals between the references above the minimum reference are wide enough to avoid memory cell read errors.

Another aspect of the present invention is to provide a method and a circuit for testing memory cells in a multilevel memory which can be implemented circuitally without any additional circuits with respect to those normally present in a memory device.

Yet another aspect of the present invention is to provide a method and a circuit for testing virgin memory cells in a multilevel memory which are highly reliable, relatively easy to provide and at competitive costs.

These and other benefits and advantages, which will become apparent hereinafter, are achieved by a method for testing virgin memory cells in a multilevel memory device having a plurality of memory cells, that includes:

reading the individual memory cells that constitute a memory device and comparing each one of said memory cells with at least one reference memory cell at a time, so as to determine whether the threshold of said memory cells is lower than the threshold of said at least one reference memory cell or not;

determining the number of said memory cells whose threshold is higher than the threshold of said at least one reference cell;

said at least one reference memory cell being chosen with a gradually higher threshold; and when said number of memory cells whose threshold is higher than a given reference threshold is found to be sufficiently lower than the number of redundancy memory cells provided in the memory device, assuming said given reference threshold as lower reference threshold for said memory device, determining a statistical distribution of the thresholds of said memory cells.

BRIEF DESCRIPTION OF THE DRAWINGS

Further characteristics and advantages of the invention will become apparent from the description of a preferred but not exclusive embodiment of the device and of the method according to the invention, illustrated only by way of non-limitative example in the accompanying drawings, wherein.

DETAILED DESCRIPTION OF THE INVENTION

Figure 1:
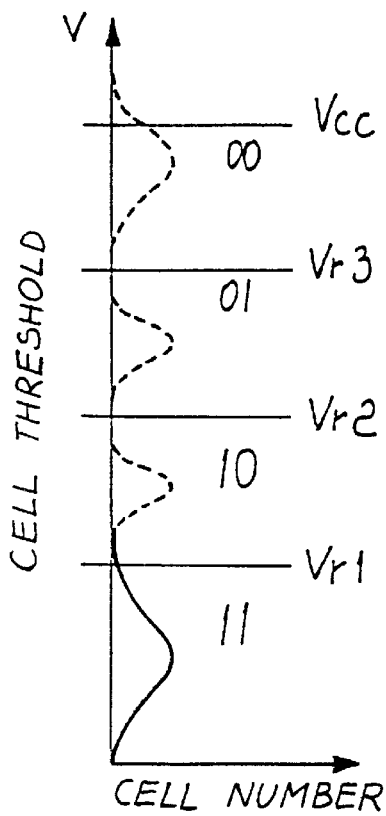
FIG. 1 is a chart which plots the statistical distribution of erased cells and the various threshold levels of the references used to discriminate the logic values during reading in a memory cell with multiple levels.

Since FIG. 1 has already been described, it is not discussed further. Accordingly with reference to FIGS. 2 and 3, a method for testing cells, and in this embodiment virgin cells, of a multilevel permanent memory device is described.

An exhaustive and sufficiently rapid measurement of the thresholds in a memory matrix consists in reading said matrix by means of sense amplifier circuits, in which the threshold of the cells is compared with the threshold of the reference.

Therefore, it is assumed that there is at least one reference memory cell and at least one corresponding sense amplifier in order to compare each memory cell with said reference memory cell.

The method according to one embodiment of the invention provides for performing successive read operations on the whole memory matrix, using as reference each time memory cells whose thresholds are gradually higher, starting from a threshold which approaches the average value of the cells erased by ultraviolet rays.

Figure 2:
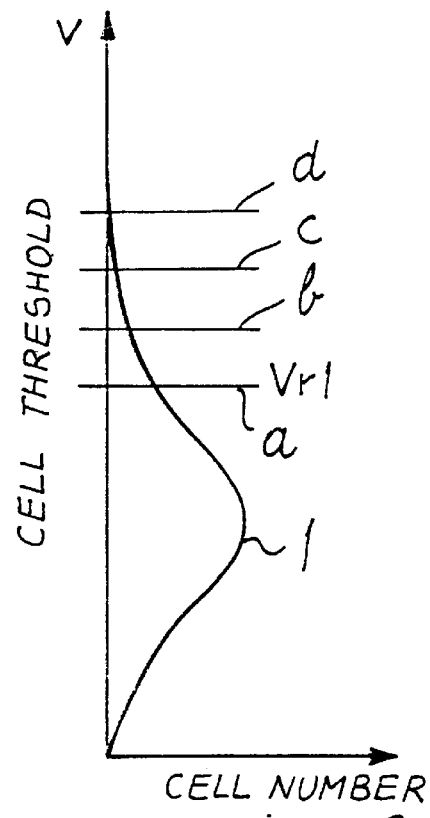
FIG. 2 is a chart which plots the distribution of erased cells and thresholds of the references used to measure their statistical distribution, with the method according to the present invention.

FIG. 2 is a chart in which the axis of the ordinates plots the thresholds of the cells and the axis of the abscissae plots the number of the memory cells.

The curve designated by the reference numeral 1 represents the distribution of the erased cells as a function of the thresholds of the cells.

It is noted that as the threshold of the cell increases, the number of cells whose threshold is higher than the threshold of the reference cells decreases and therefore said cells can be easily replaced by cells provided on redundancy lines.

If instead there is a large number of memory cells whose threshold is higher than the threshold of the reference cells, it is of course not possible to replace all the memory cells and therefore said cells must be rejected.

The chart of FIG. 2 therefore allows to determine a minimum reference threshold Vr1, above which the memory cells must be rejected because the number of cells whose threshold is higher than the reference cells is too high to allow replacement by redundancy.

Therefore, by counting, for each read cycle, the number of memory cells whose output is a logic value 0, the resulting number yields the number of memory cells whose threshold is higher than the reference threshold. As the threshold of the reference cell gradually increases, as shown in FIG. 1, in which the letters A, B, C and D designate, respectively, thresholds which increase gradually starting from a threshold which is close to the average value of the erased cells whose true virgin state is to be checked, the number of memory cells above said threshold must necessarily decrease.

When this number reaches a reasonably low value, as shown in the trailing portion of the curve 1 of FIG. 2, i.e., in the portion located toward the higher values of the axis of the ordinates, the reference threshold used, for example the threshold A, can be used as lower reference level Vr1. Said reasonably low value is dependent on the capacity of the redundancy section, i.e., on the number of memory cells that can be made redundant by means of the redundancy lines.

In this manner, the value of Vr1 is optimum with respect to the distribution of the thresholds of the memory cells in the matrix and with respect to the amount of redundancy available.

If a memory cell is normally read by using one or more sense amplifiers, it is possible to use all the sense amplifiers simultaneously in parallel, each with a different reference, and to reencode the resulting output before performing the count.

In this manner, each memory cell is compared in parallel with a plurality of reference memory cells which have gradually higher thresholds.

Figure 3:
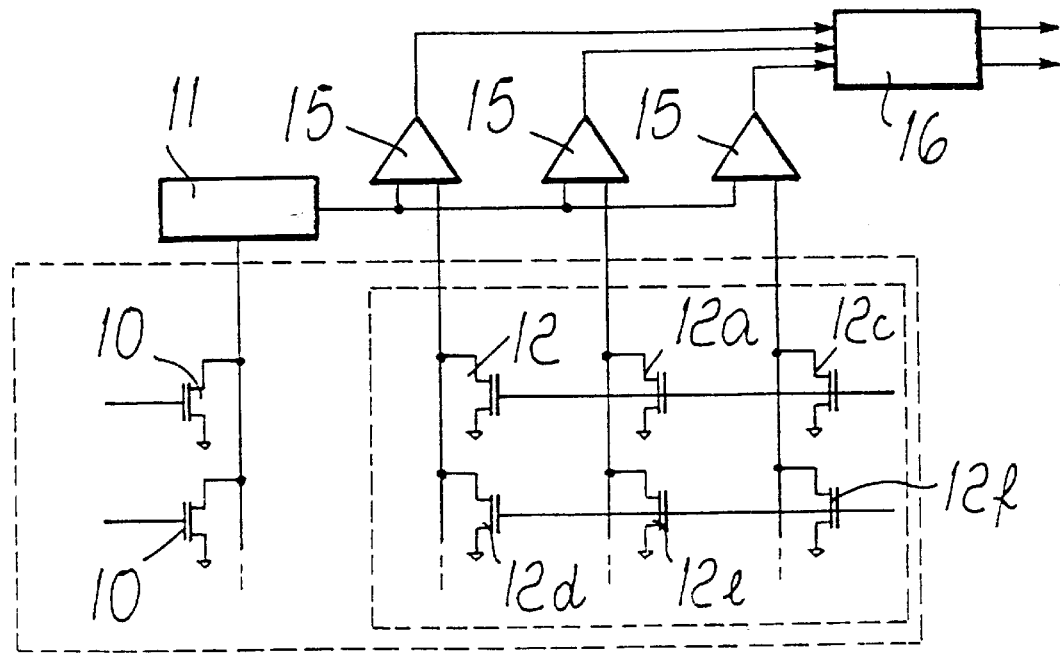
FIG. 3 is a circuit diagram of an implementation of the method according to the present invention.

In this regard, reference is made to the circuit of FIG. 3, which illustrates a circuit implementation of this case.

The reference numerals 10 designate memory cells whose virgin state is to be checked; the reference numeral 11 designates column multiplexer means which are suitable to perform a selection of the memory cells 10 that belong to assigned lines of the memory matrix.

The reference numerals 12, 12a, 12c, 12d, 12e and 12f instead respectively designate reference memory cells which have gradually higher thresholds and are connected to respective sense amplifier means 15, whose output is connected to encoder means 16 which are adapted to encode the results before counting the memory cells whose threshold exceeds the threshold of the reference memory cells.

The reference memory cells 12, 12a, 12c, 12d, 12e and 12f have gradually increasing channel lengths. Comparing the thresholds of memory cells with the thresholds of reference cells in fact entails comparing their currents; accordingly, in order to have gradually higher thresholds it is necessary to have decreasing currents. One simple way to provide decreasing currents starting from values which are close to the values of the erased matrix cells (i.e., of the cells whose virgin state is to be checked) consists in using memory cells erased by means of ultraviolet rays and having increasing channel lengths starting from a value which is close to the value of the matrix cells to be tested.

These reference cells are already in the matrix and do not require additional circuits in order to use them. Moreover, they undergo the same process-dependent variations as all the other cells of the memory matrix and therefore any process drift problems are avoided.

In practice, the above-described method easily and quickly provides a measurement of the trailing region of the distribution of the thresholds of the matrix cells erased by ultraviolet rays. This measurement is essential in order to decide optimally the low reference level in multilevel memory devices. The circuit implementation that is provided requires no additional circuits.

In practice, it has been observed that the method and the circuit according to the invention fully achieve the intended aim. The invention can be used for memory cells of any kind of memory.

The method and the circuit thus conceived are susceptible of numerous modifications and variations, all of which are within the scope of the inventive concept; all the details may furthermore be replaced with other technically equivalent elements.

Where technical features mentioned in any claim are followed by reference signs, those reference signs have been included for the sole purpose of increasing the intelligibility of the claims and accordingly such reference signs do not have any limiting effect on the interpretation of each element identified by way of example by such reference signs.

What is claimed is:

1. A method for testing memory cells in a multilevel memory device having a plurality of memory cells, comprising:
   reading the individual memory cells that constitute a memory device and comparing each one of said memory cells with at least one reference memory cell at a time to determine whether the threshold of said memory cells is lower than the threshold of said at least one reference memory cell;
   determining the number of said memory cells whose threshold is higher than the threshold of said at least one reference cell;
   said at least one reference memory cell being chosen with a gradually higher threshold;
   when said number of memory cells whose threshold is higher than a given reference threshold is found to be sufficiently lower than the number of redundancy memory cells provided in the memory device, assuming said given reference threshold as lower reference threshold for said memory device, determining a statistical distribution of the thresholds of said memory cells.

2. The method of claim 1, further comprising:
   reading and comparing the individual memory cells with a plurality of reference memory cells at a time, said plurality of reference memory cells having gradually higher thresholds.

3. The method of claim 2 wherein determining the number of memory cells comprises counting the number of memory cells whose threshold is higher than said reference memory cells, and encoding the results of the comparison of each memory cell with said plurality of reference memory cells having gradually higher thresholds.

4. The method of claim 2 wherein the step of comparing said memory cells with said reference memory cells consists in comparing the currents of said memory cells.

5. The method of claim 2 wherein said reference memory cells having gradually rising thresholds have increasing channel lengths and currents whose value respectively decreases.

6. The method of claim 5 wherein said reference memory cells are erased memory cells whose channel lengths increase starting from channel values that are close to the channel values of said memory cells meant to be compared with said reference memory cells.

7. A circuit for testing virgin memory cells in a multilevel memory device having a plurality of memory cells, comprising: a plurality of reference memory cells suitable to be compared with one at a time to said memory cells whose true virgin state is to be determined, the plurality of reference memory cells having a gradually rising threshold and whose channel length increases and currents respectively decrease; and a plurality of sense amplifier means suitable to perform the comparison step of each one of said memory cells with said plurality of reference memory cells.

8. The circuit of claim 7, comprising encoder means connected in output to said plurality of sense amplifier means.

9. The circuit of claim 7, comprising column multiplexer means interposed between said sense amplifier means and said memory cells to be compared with said reference memory cells.

10. The circuit of claim 7 wherein said reference memory cells comprise memory cells that are normally present in a memory device and whose channel length is close to that of said memory cells meant to be compared with them.

11. A method for testing memory cells, comprising:
    determining the threshold value of each memory cell;
    determining a reference threshold value above which the number of memory cells having a higher threshold value does not exceed a predetermined number of available redundant memory cells.

12. The method of claim 11 wherein determining the threshold value of each memory cell further comprises determining a statistical distribution of the threshold values of the memory cells.

13. The method of claim 12 wherein determining the threshold value of each memory cell comprises comparing the threshold value of each memory cell to the threshold value of a plurality of reference cells.

14. The method of claim 13 wherein comparing the memory cells to the reference cells comprises comparing the currents of the memory cells to the current of the reference cells.

15. The method of claim 12 wherein determining the threshold value of each memory comprises performing a parallel comparison of each one of the memory cells with the plurality of reference cells that are each configured to have incrementally higher threshold values.

16. The method of claim 15 wherein determining a statistical distribution comprises encoding the results of the parallel comparison of each memory cell to the plurality of reference cells; and
    determining the reference threshold value includes measuring a trailing region of the distribution of the threshold value of the memory cells that is greater than a predetermined threshold value.

17. A circuit for testing memory cells having threshold values, comprising:
    a plurality of reference cells, each reference cell having a threshold value;
    a multiplexor for selectively coupling each memory cell to the plurality of reference cells;
    a comparator configured to compare the threshold value of each memory cell to the threshold values of the plurality of reference cells;
    means for determining a reference threshold value above which the number of memory cells having a higher threshold value does not exceed a predetermined number of available redundant memory cells.

18. The circuit of claim 17 wherein the plurality of reference cells are coupled in parallel to the comparison means.

19. The circuit of claim 18 wherein the reference cells are configured to have incrementally higher threshold values and respective decreasing current values.

20. The circuit of claim 18 wherein the comparator comprises one or more sense amplifiers.

21. The circuit of claim 17 wherein the means for determining a reference threshold value comprises an encoder configured to encode the results of comparing the threshold value of each memory cell to the threshold value of the plurality of reference cells.

22. The circuit of claim 17 wherein the reference cells, the memory cells, and the redundant memory cells comprise a matrix of memory cells.

* * * * *